(12) United States Patent
Boero et al.

(10) Patent No.: US 9,043,008 B2
(45) Date of Patent: May 26, 2015

(54) MODELING DEFECT MANAGEMENT AND PRODUCT HANDLING DURING THE MANUFACTURING PROCESS

(75) Inventors: Andrea Boero, Genoa (IT); Ignazio Selvaggio, Genoa (IT)

(73) Assignee: Siemens Aktiengesellschaft, Munich (DE)

( * ) Notice: Subject to any disclaimer, the term of this patent is extended or adjusted under 35 U.S.C. 154(b) by 515 days.

(21) Appl. No.: 13/238,823

(22) Filed: Sep. 21, 2011

(65) Prior Publication Data

US 2012/0109353 A1 May 3, 2012

(30) Foreign Application Priority Data

Oct. 29, 2010 (EP) .................................... 10189479

(51) Int. Cl.
*G05B 19/00* (2006.01)
*G06Q 10/06* (2012.01)
*G05B 23/02* (2006.01)
*H01L 21/02* (2006.01)

(52) U.S. Cl.
CPC ............ *G06Q 10/06* (2013.01); *G05B 23/0245* (2013.01); *H01L 21/02381* (2013.01)

(58) Field of Classification Search
USPC .......................... 700/108–110, 28–32; 702/84
See application file for complete search history.

(56) References Cited

U.S. PATENT DOCUMENTS

| 4,628,008 | A | * | 12/1986 | Conolly ......................... 428/548 |
| 4,799,010 | A | * | 1/1989 | Muller .......................... 324/240 |
| 5,452,218 | A | * | 9/1995 | Tucker et al. .................. 700/110 |
| 5,761,336 | A | * | 6/1998 | Xu et al. ........................ 382/141 |
| 5,857,192 | A | * | 1/1999 | Fitting ................................. 1/1 |
| 5,889,674 | A | * | 3/1999 | Burdick et al. ................ 700/121 |
| 6,091,846 | A | * | 7/2000 | Lin et al. ........................ 382/145 |
| 6,246,787 | B1 | * | 6/2001 | Hennessey et al. ............ 382/141 |
| 6,483,938 | B1 | * | 11/2002 | Hennessey et al. ............ 382/149 |
| 7,024,263 | B2 | * | 4/2006 | Drake et al. ..................... 700/97 |

(Continued)

OTHER PUBLICATIONS

Bakir, B.; Batmaz, I.; Gunturkun, F.A.; Ipekci, I.A.; Koksal, G. and Ozdemirel, N.E., "Defect Cause Modeling with Decision Tree and Regression Analysis", 2008, World Academy of Science, Engineering and Technology, vol. 24.*

(Continued)

*Primary Examiner* — Mohammad Ali
*Assistant Examiner* — Kelvin Booker
(74) *Attorney, Agent, or Firm* — Laurence A. Greenberg; Werner H. Stemer; Ralph E. Locher

(57) ABSTRACT

A method models a defect management routine. Both the modeling and a handling are executed within a manufacturing execution system. During an engineering phase: modeling the production process and creating a library of possible defect types which may occur; assigning the defect types to at least one defect group; creating a library of defect specifications; creating a library of defect type specification details; creating at least one runtime defect criteria that is used to link the defect type to a certain production volume; and creating a runtime defect measurement routine that monitors a corrective measure. During a runtime production phase evaluating the product produced; identifying the respective defect type out of the library of defect types; and using the identified defect type to determine a corrective measure, a runtime defect criteria identifying the resource causing the defect type, a production volume, and to run the respective runtime defect management routine.

7 Claims, 5 Drawing Sheets

(56) References Cited

U.S. PATENT DOCUMENTS

| | | | |
|---|---|---|---|
| 7,089,075 B2* | 8/2006 | Hasan | 700/121 |
| 7,209,846 B2* | 4/2007 | Tamaki et al. | 702/84 |
| 7,415,386 B2* | 8/2008 | Burch et al. | 702/183 |
| 7,761,778 B2* | 7/2010 | Burg | 714/799 |
| 8,230,220 B2* | 7/2012 | Xiao et al. | 713/169 |
| 8,417,715 B1* | 4/2013 | Bruckhaus et al. | 707/758 |
| 8,732,669 B2* | 5/2014 | Valdiviezo Basauri et al. | 717/126 |
| 2002/0087567 A1* | 7/2002 | Spiegler et al. | 707/100 |
| 2004/0036863 A1* | 2/2004 | Matsusita et al. | 356/237.2 |
| 2004/0117771 A1* | 6/2004 | Venkatapathy | 717/130 |
| 2004/0203179 A1* | 10/2004 | Hata | 438/17 |
| 2004/0228515 A1* | 11/2004 | Okabe et al. | 382/145 |
| 2004/0234152 A1* | 11/2004 | Liege et al. | 382/254 |
| 2005/0222909 A1* | 10/2005 | Takahashi et al. | 705/22 |
| 2006/0047454 A1* | 3/2006 | Tamaki et al. | 702/84 |
| 2006/0069958 A1* | 3/2006 | Sawicki et al. | 714/33 |
| 2006/0106477 A1* | 5/2006 | Miyashita | 700/103 |
| 2008/0097734 A1* | 4/2008 | Raffo | 703/6 |
| 2010/0083349 A1* | 4/2010 | Xiao et al. | 726/1 |
| 2010/0228510 A1* | 9/2010 | Okubo | 702/81 |
| 2012/0136692 A1* | 5/2012 | Ohishi et al. | 705/7.26 |
| 2012/0226476 A1* | 9/2012 | Shingaki et al. | 702/181 |

OTHER PUBLICATIONS

ElMekkawy, T.Y.; Hachkowski, P.A.; Strong, D. and Mann, D.D., "Defect Analysis for Quality and Productivity Improvements in a Manufacturing System", 2006, Canadian Biosystems Engineering, vol. 48.*

Jalote, P. and Agrawal, N., "Using Defect Analysis Feedback for Improving Quality and Productivity in Interative Software Development", Dec. 2005, ITI 3rd International Conference on Information and Communications Technology.*

Suma V and Gopalakrishnan Nair T.R., "Defect Management Strategies in Software Development",2009, Recent Advances in Technologies, Maurizio A Strangio (Ed.), ISBN: 978-953-307-017-9, InTech.*

* cited by examiner

MODELING DEFECT MANAGEMENT AND PRODUCT HANDLING DURING THE MANUFACTURING PROCESS

CROSS-REFERENCE TO RELATED APPLICATION

This application claims the priority, under 35 U.S.C. §119, of European application EP 10189479, filed Oct. 29, 2010; the prior application is herewith incorporated by reference in its entirety.

BACKGROUND OF THE INVENTION

1. Field of the Invention

The present invention relates to a method for modeling a defect management routine in a manufacturing process and for handling the defect during the production process based the defect management routine.

As it is well known, the art according to the ISA S-95 standard, a method for managing and controlling manufacturing processes planned by an Enterprise Resource Planning (ERP) and produced by a shop floor, provides a manufacturing executing system (MES) for implementing the planned manufacturing processes and controlling the corresponding production steps at shop floor.

In particular, the Enterprise Resource Planning (ERP) is a system including hardware devices and corresponding software applications for planning the business resources of an enterprise, i.e. material provisions, human resource management, purchasing, orders, profits, finance, inventory controls, customer management, etceteras, while the term "shop floor" has been used to indicate a system supporting the control of single machines involved in the manufacturing processes, for example by measuring the number of pieces produced per hour by each machine or the functioning parameters thereof, the quality of the pieces produced and so on.

As schematically represented in FIG. 1, MES is an intermediate layer providing computing machines and software tools 1-n between the ERP upper layer and the shop floor lower layer, including a software tool for production order management 1, which receives requests of production from the ERP, and a software tool for production modeling 2, which supports the engineering phases of selecting and managing the resources to be involved in the manufacturing processes, i.e. employees, machines and materials, in order to realize a planned manufacturing process within required time constrains.

MES is based on the International Standard Association (ISA) standard S95 which defines how software tools 1-n may implement the production at shop floor level and how communicating with it. More particularly, as represented in FIG. 2, S95 is substantially based on a manufacturing process represented by a plurality of sequential process segments PS1, PS2, PS3, PS4 wherein each sequential process segment contains a plurality of actions A1, An to be performed sequentially at the shop floor level.

An execution of the MES software tool described above includes the management of the manufacturing process by activating a sequential process segment PS1 and sequentially executing the corresponding plurality of actions A1, An.

More particularly, in order to complete a manufacturing process, the software tool for production order management 1 substantially repeats the steps of activating and waiting the end of a plurality of sequential process segments, for a plurality of process segments. In this case, a plurality of software tools, corresponding to respective sequential process segments, is executed for the duration of the corresponding sequential process segment.

Advantageously, MES supports very well the manufacturing processes including sequential process segments which may be executed synchronously and continuously, for example in industrial production processes or batch industries which are implemented by well described algorithms or sequential steps, as it is for instance, in a food producing process of the type involving the following steps "fill mixer with material 1", "fill mixer with material 2", "mix material for 10 minutes", and "discharge", wherein the material 1, material 2 as well as the mixer are available.

However, MES does not support as well manufacturing processes including some processes which may be stopped for long periods, for example due to the lack of a resource, machine, material or personnel required to perform it. This occurs especially in discrete manufacturing processes, for example in automotive factories, as schematically represented in FIG. 2.

In this figure, the manufacturing process of assembling a car engine with the external structure of the car is schematically represented with a sequence of four sequential process segments wherein the first segment PS1 provides the engine assembling, the second segment PS2 the external structure assembling, the third segment PS3 the coloring of the external structure already assembled and the last segment PS4 the mounting of the assembled engine with the external structure already colored.

Each sequential process segment PS1-P4 contains a plurality of actions A1, A2, A3, A4, A5, An which are executed sequentially, i.e. action An cannot be executed until all the previous actions are terminated.

In this case, a first software tool for production order managing 1 is executed for activating the first action of segment PS1 and it remains in execution until the last action An of the process segment PS1 is ended, even if one action A3 is suspended for a long period. For example, even if some pieces of the engine are not available, because not already ordered or delivered to the plant floor, the software tool corresponding to the first segment PS1 is executed. A second software tool is executed for activating the first action A1 of process segment PS2 and it remains in execution until the last action An of the process segment PS2 is ended. In the same way, a third and a fourth software tools are executed for activating the first actions A1 of the corresponding sequential process segments PS3 and PS4 and waiting the end of their execution.

Also the second, third and fourth software tools are executed when some actions of the corresponding sequential process segments PS2, PS3, PS4 are suspended, for example because a door to be assembled in process segment PS2 is not already available and a color to be used in process segment PS3 has been used up.

This involves a great overcharge of computing machines executing the software tools, as well as a great number of computing machines involved in executing such software tool, especially when the manufacturing process is implemented by a high number of sequential process segments.

In other words, sequential process segments as defined above apply very well in industrial production processes and in general where process segment executions actually manage action which are continuously executed, so that the process segment execution cost is largely paid by a process control benefit.

However, it does not apply in discrete manufacturing processing, wherein there is no real process control continuously running during a complete life cycle of some products but a plurality of commands should be sent to machines at the plant floor level for producing a lot of products which are then moved to other machines. Moreover, in discrete manufacturing processing, many of the commands are issued manually by personnel, rather than automatically with predetermined order by an on top controller.

Further, defect identification and individuation as well as tracing of performed remedial action are generally a substantial topic within the MES application. Unfortunately, up to now the model according to the S-95 standard does not at all reflect these general requirements which consists for example in the need to catalog defects and give the users the opportunity to handle defects/anomalies in the production process also within the usually complex environment of a production plant. Further, the S-95 standard is currently completely silent about the tracing of extra work being performed on secondary lines in order to recover rejected products/pieces coming out of the production process.

SUMMARY OF THE INVENTION

It is accordingly an object of the invention to provide a method for modeling a defect management routine in a manufacturing process and for handling the defect during the production process based on the defect management routine which overcome the above-mentioned disadvantages of the prior art methods and devices of this general type, which manages defective products with the production process and for tracing an automatically executed corrective action process in order to recover the defective products or pieces.

The objective is achieved according to the present invention by a method for modeling a defect management routine in a manufacturing process and for handling the defect during the production process based on the defect management routine, both the modeling and the handling are executed within a manufacturing execution system. During an engineering phase the following steps are performed: modeling the production process as well as creating a library of possible defect types which may occur possibly during the production process; assigning the defect types to at least one defect group representing a hierarchical clustering to collect different but related defect types; creating a library of defect specifications, each defect specification being linked to the defect types; creating a library of defect type specification details assigning the defect types to a resource-related context; optionally assigning an image of a correct product manufactured according to the production process to the defect type; creating at least one runtime defect criteria that is used to link the defect type to a certain production volume; and creating a runtime defect measurement routine that monitors a result of a corrective measure executed after the identification of the defect type. During a runtime production phase performing the following steps: evaluating the product produced according to the production process against predetermined quality criteria; identifying the respective defect type out of the library of defect types in case of a violation of the predetermined quality criteria; and using the identified defect type to determine and execute the corrective measure, determine the runtime defect criteria identifying the resource causing the defect type, determine the production volume possibly affected by this defect type, and run the respective runtime defect management routine.

The present method now allows to model within the S-95 standard environment a complete defect management routine during the engineering phase which will enable the production process during the runtime phase to identify deviations of the predetermined quality criteria and remedy the possible defects within the production plant thereby monitoring the success of the remedial actions and protocoling the course of the remedial actions. This method is a big relief for the personal at shop floor level since a worker at shop floor level is therefore no longer required to identify a defect and subsequently think about and execute the appropriate corrective measure in order to remedy the identified defect. Any new defect which was for example out of reach during the engineering phase can be modeled also during the course of production allowing to up-date the defect management routine also on the fly.

Advantageously, the method may further comprise the step of assigning to each defect type a default severity. The default severity can be further used in the defect management routine to whether some corrective actions have to be prioritized within the production process. The execution of the corrective action/measure can be, for example, rely upon the absolute value for the severity. Alternatively, the value for the severity can be also used as a threshold to identify the non-effectiveness of any remedial action yielding for example a command to abandon any corrective action and start the production process or a production segment within the production process with new material being then processed on an alternative route.

Further advantageously, the method may contain the step of shaping the organization of the group as a tree structure thereby configuring a type of group ownership at a desired level of the group hierarchy. This structure allows to sort the defect types and supports the user in quickly investigating inside the library of defect types as well as in a catalogue of currently available and/or remedied defect type events. In dependence on the group ownership, the availability of filters on MES entities or on criteria that identify the reason for non-conformity are accessible.

Typically, the library of defect specifications may contain a number of defect specification criteria; the defect specification criteria are an out of range failure criteria, a beyond tolerance failure criteria and an out of foreseen set values failure criteria. This information which is accessible to any user connected to the MES give the defect management routine to specify the nature of the defect type identified.

Furthermore, the library of defect type specification details may allow to classify a defect type to a single production resource or to a single production line or to a production line typology or to a particular material or to a class of materials or to a well-defined production process segment. This inventive feature is of great use for the MES user, too, since this information reflects whether only one production resources is causing the defect etc. and gives the defect management routine the power to relate the defect type to a specific MES entity, such as a single production resource, a single production line, etc.

Other features which are considered as characteristic for the invention are set forth in the appended claims.

Although the invention is illustrated and described herein as embodied in a method for modeling a defect management routine in a manufacturing process and for handling the defect during the production process based on the defect management routine, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

With reference to the figures schematically represented is a method for modeling a defect management routine in a manufacturing process and for handling the defect during the production process based on the defect management routine.

Figure 1:
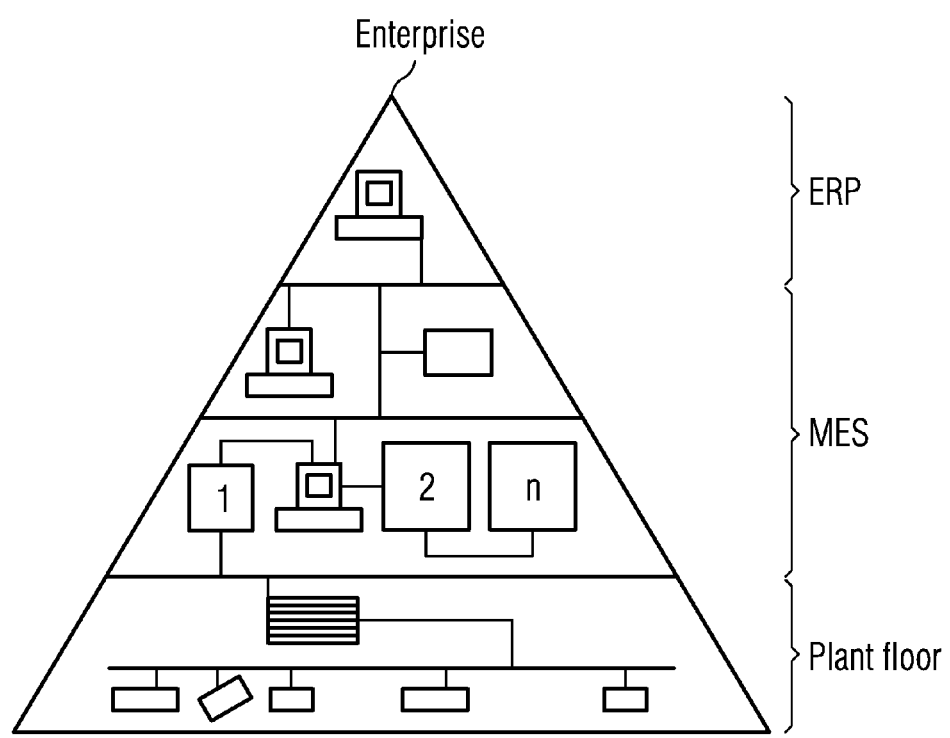
FIG. 1 is an illustration showing a method for managing and controlling manufacturing processes, according to the prior art.
Figure 2:
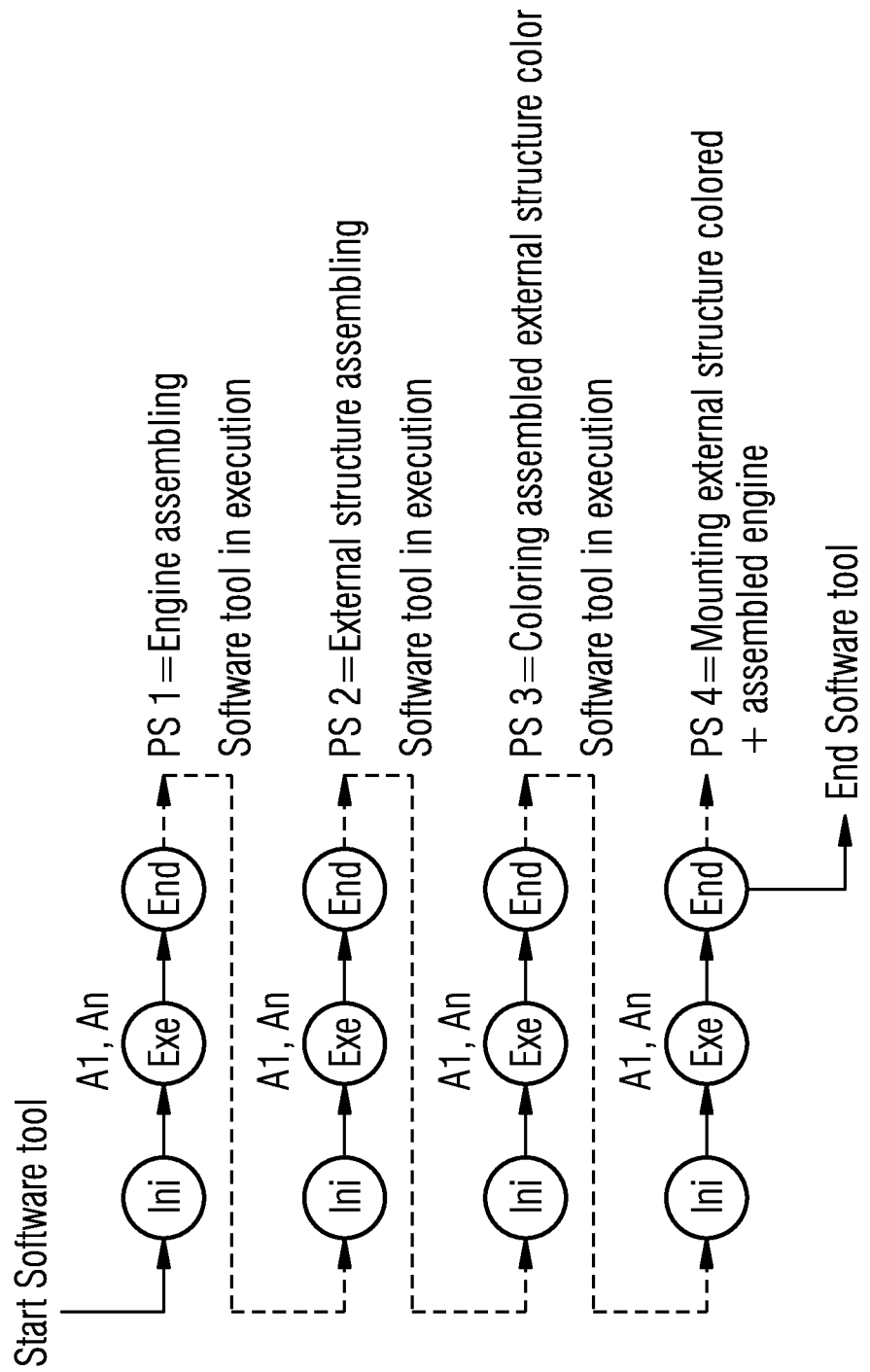
FIG. 2 is an illustration showing the steps of defining sequential process segments for implementing the planned manufacturing process according to FIG. 1 according to the prior art.
Figure 3:
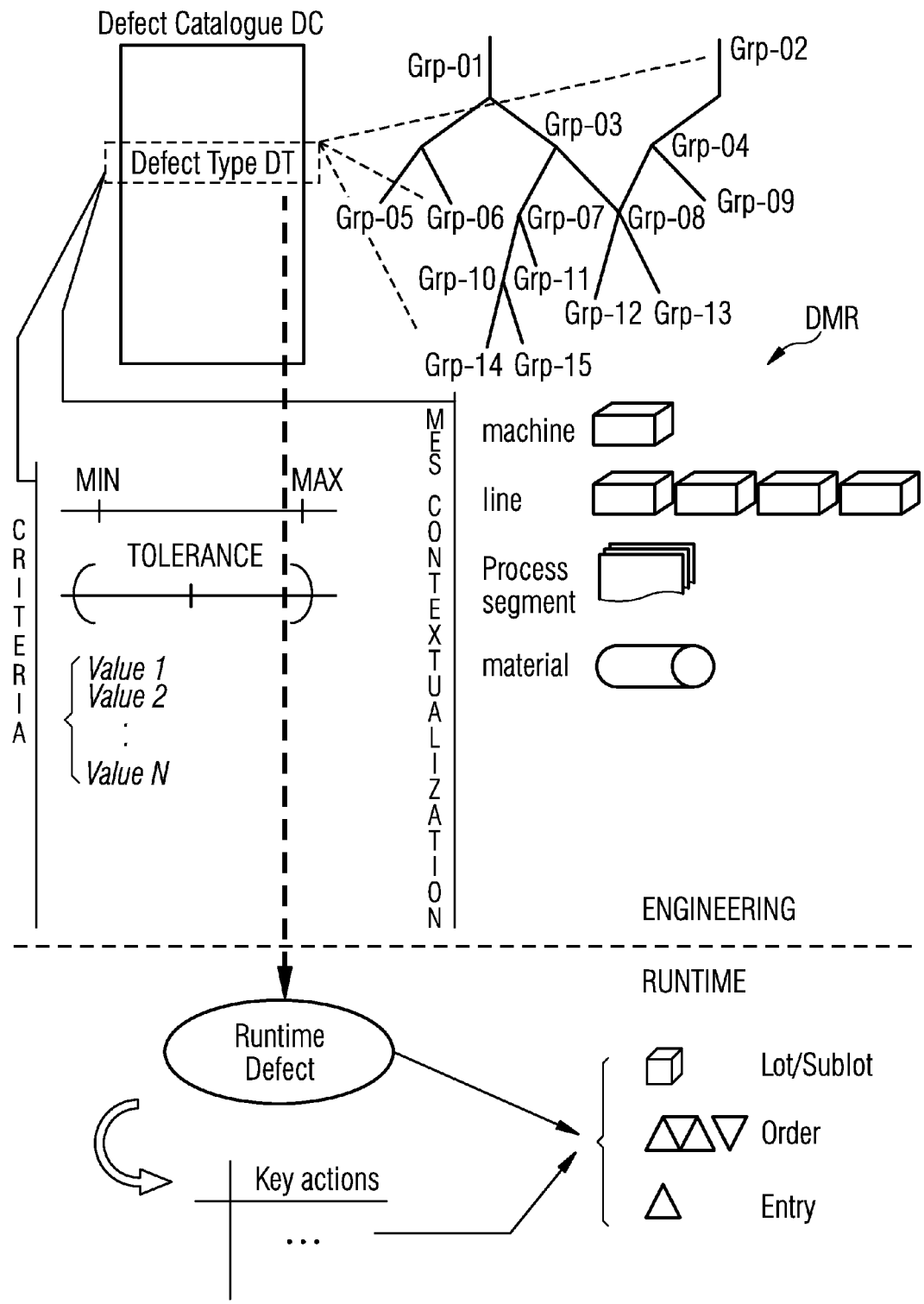
FIG. 3 is an illustration showing a functional structure of the defect management routine according to the invention.
Figure 4:
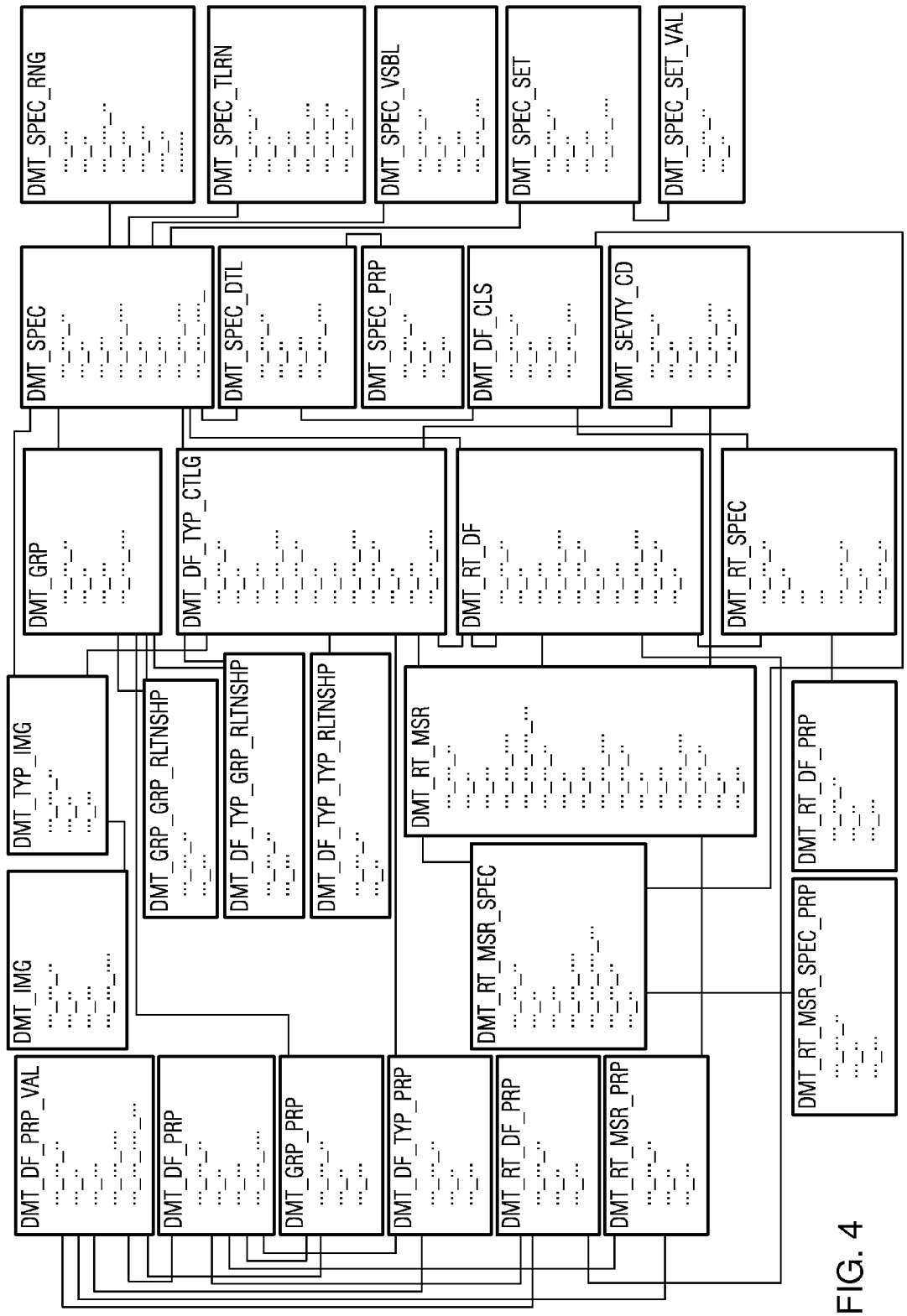
FIG. 4 is an illustration showing the implementation of the defect management routine into the S-95 standard framework.

FIG. 3 schematically represents the functional structure of a defect management routine DMR being both modeled and handled within a manufacturing execution system MES. In the ISA S-95 standard data model, the present invention provides a number of new entities being used for the modeling and the running of the defect management routine DMR (the exact structure is given in FIG. 4).

The present invention defines a Defect Type DT representing a library template describing an anomaly that can occur in the production process PS1 to PS4. This defect type DT is characterized by an Id and a unique Code and supplied with a default severity DMT_SEVTY_CD. All Defect Types DT together define a defect catalogue DC of all possible defect types that can occur during the production process PS1 to PS4. The next new entity is a Group Grp-01 to Grp-15 which represents a hierarchical clustering of all defect types DT being used to logically collect single different defect types DT. Each group Grp-01 to Grp-15 is characterized by an Id. The organization of the groups GRP-01 to Grp-15 is shaped as a tree structure. The ownership of a distinct defect type DT to a distinct group Grp-01-Grp-15 can be configured at any level of group hierarchy and each defect type DT can belong to more than one group Grp-01 to Grp-15.

The next new entity is a Defect Specification DMT_SPEC which represents a collection of additional information that can be specified for single defect types DT or, as an alternative, for groups Grp-01 to Grp-15. The defect specification DMT_SPEC is characterized by an Id and a unique Anomaly-Code. In a preferred embodiment of the present invention, the additional information provides three criteria categories that are evaluated in order to further systemize a disclosed defect type. Presently, the criteria can include an "out of range failure"-criteria, a "beyond tolerance failure"-criteria, an "out of foreseen set values failure"-criteria and a criterion category that can evaluated for the disclosure of the defect, for example a defect having a naked-eye visibility.

A further entity newly designed is a Defect Type Specification Detail DMT_SPEC_RNG, DMT_SPEC_TLRN, DMT_SPEC_SET, DMT_SPEC_VSBL which represents a MES contextualization. According to this entity, defect types DT can be classified as defect templates for a single production machine or typical of a single production line (equipment), typical of a production line typology (equipment class), or occurring on a particular material (material definition), or on a class of materials (material class) or typical of a well-defined production process (process segment) as this is illustrated in FIG. 3.

Another new entity is the Image DMT_IMG which represents, in terms of a physical path, a picture that can be associated to a single Defect Type DT or to a Defect Type Specification DMT_SPEC. It is supposed to represent the same piece/product with and without defect (in terms of a couple of images for each Defect Type or Defect Type Specification).

The next new entity is named Runtime Defect DMT_RT_DF and represents an instance of a particular template type. It is the result of a defect type identification on the plant and of its respective mapping inside the defect type catalogue DC. It is characterized by a Code. While defect type templates may be optionally contextualized inside MES environment, a Runtime Defect DMT_RT_DF usually needs to be always contextualized. Doing the contextualization, the Runtime Defect DMT_RT_DF must be linked to a production lot, a sub lot, an order or an entry in order to identify the goods and orders which are quality-wise affected by the occurrence of a specific defect type DT. At this point it is possible to obviously define more than one association. This MES association is called Runtime Defect Specification.

The next new entity is the Runtime Defect Measurement DMT_RT_MSR which represents a trace of a corrective action performed on pieces that missed the quality requirement due to the occurrence of a defect type in order to recover defect pieces/products. The runtime defect measurement entity is characterized by an Id (by default set as unique if not specified). Measurements are dedicated to trace all the key actions of a corrective process, i.e. piece delivering to a secondary recovering line, analysis of the improvement (if present) achieved after reworking, evaluation of the state of non-conformity, revealing of false positives, recovering fulfilment and so on. It is helpful when each measurement is contextualized inside an MES environment. If not specified, the default is that one of runtime defect DMT_RT_DF which measurement refers to. Otherwise new contextualizations can be added during the recovering phase in order to shape, for example, the transformation of a lot into a new one.

The advantages of this bunch of new entities in the S-95 standard are those ones of a flexible and unified model, adaptable to well shape defects occurrences inside the MES environment. The introduced model supports the user of the MES in a quick investigation inside the catalogue DC of the defect types (supposed the catalogue contains all possible defect type templates). Thanks to the individualizable ownership of groups, an availability of filters on MES entities or on specific criteria are easily to be configured helping to identify and remedy a reason of non-conformity. This new model also allows dynamic links to the world of all MES entities thereby having the opportunity to update in a mode keeping trace of the history of amendments thereby also keeping trace of previous values. Of course, this measure joins together flexibility and strictness in tracing changes in the production process.

Since already many of the reference signs mentioned earlier refer to FIG. 4, FIG. 4 in general schematically shows the implementation of the defect management routine DMR into the S-95 standard framework data model. The titles heading the boxes which each represent a new S-95 data model entity and, of course, their relationships are insofar almost self-explanatory.

At engineering time, the catalogue table DMT_TYP_CTLG will be filled with all defect types relative to the shadow is going to be investigated at runtime. As example of discrete production, relatively to the body of a car, possible examples of predefined types could be: dent, fading, scratch, unexpected color, unexpected dimension and the like.

Each type can be specified for a particular product, so referring to the identifying code of a door typology, for example ID-FG04-5R78-64HJ-765MM (let's suppose FIAT 500 door). In this case for each of previous mentioned types, a new record will be inserted into table DMT_SPEC, containing as anomaly code (SPEC_ANM_CD), the value ID-FG04-5R78-64HJ-765MM. With this detail, each type can be further on specified, i.e. defining criteria.

For example, unexpected color defect type can be provided with the set of allowed colors for that type of door for a specific production line (red, black, deep blue) modeling it inside tables DMT_SPEC_SET/DMT_SPEC_SET_VAL; unexpected dimension defect type can be detailed with criteria of thickness, defining a minimum and maximum value inside table DMT_SPEC_RANGE or a reference value inside DMT_SPEC _TOLERANCE with a proper tolerance; dent, fading and scratch defect types can be set as visible defects, inside table DMT_SPEC_VSBL.

For each defect type a severity code is defined at this level, with the possibility of overwriting it at runtime for the specific instance (DMT_SEVTY_CD). Defect type can be further enriched by defining the MES context. For example, all previous defect types can be associated to the material definition "door" (or FIAT 500 door, depending on the way of modelling, i.e. if detailed at runtime level or directly at engineering level), to the material class car body. Unexpected color or fading types can be further associated to the painting lines, as class typology line (equipment class), and unexpected dimension type to press lines. Defect types can be specified for proper production lines, too, defining associations to equipment as further specification of an equipment class, for example to the painting line number 4, because on that line only red, black and deep blue colouring is allowed.

All these MES elements (equipment, equipment class, material definition, material class.) are hard-coded inside table DMT_DF_CLS and each record added inside table DMT_SPEC_DTL refers to one of them. The table DMT_SPEC_DTL is provided with dedicated properties (DMT_SPEC_PRP) in order to detail MES contexts (the version of a material definition, the plant of an equipment, the library of an equipment class and so on). These defect types can be clustered to be quickly investigated.

There can be groups of Painting, Pressing, car, body, car door. The group "car" could contain "body group" that could contain the group "car door". Painting and Press could be parent groups or subgroups of car door, depending on how the process is going to be model, i.e. starting from the product or from the process. In other way, one can define groups car, body and door and then define process areas as subgroups of them or define for each process area a product clustering. According to this choice, previous defect types can be associated to only one of these groups or even to all groups. This depends on how searching criteria to be made available the respective defect types to front-end user/operator are going to be organized. For each defect type or any specification, it can be specified one or more images (DMT_TYP_IMG), in order to describe an anomaly.

All information described until now are not mandatory, so simple defect types can be defined without any other relationship. When the operator or the system (the same architecture is used to identify deviations in pharmaceutical environment) identifies an anomaly, this is added into table DMT_RT_DF, signing it as instance of a particular defect type, and, for that defect type, optionally even as an instance of a particular specification (field DF_TYP_PK and DF_SPEC_PK).

The runtime defect (instance of a defect type) must be identified by a MES contextualization, so in table DMT_RT_SPEC, there will be the reference to a particular lot (the material code of the door on which defect has been found), or to an entry/order if defect is common to a group of pieces (if defect is depending on an anomaly of the line, defect can be common to all pieces produced on that line). As a defect has been found, each runtime defect needs to be handled.

Runtime defect management comprises a series of measures (DMT_RT_MSR), i.e. of an analysis activity performed on the defect, during which different users at different levels and in different areas (piece is normally delivered to specific re-working areas before being reintroduced into production line or being definitely rejected) analyze the defect, add notes relatively to the defect, change the assigned actual severity value and perform state changes (defect is missing, defect management is in progress, defect has been solved . . . are examples of possible states).

In the example, a dent defect on the door will make door being delivered to an auxiliary press line and new measures will be added at the beginning and at the end of this process to have a feedback to the corrective action. In case of full success, the defect will be archived as resolved, otherwise new deliveries and new measures will be added for further actions and investigations.

Figure 5:
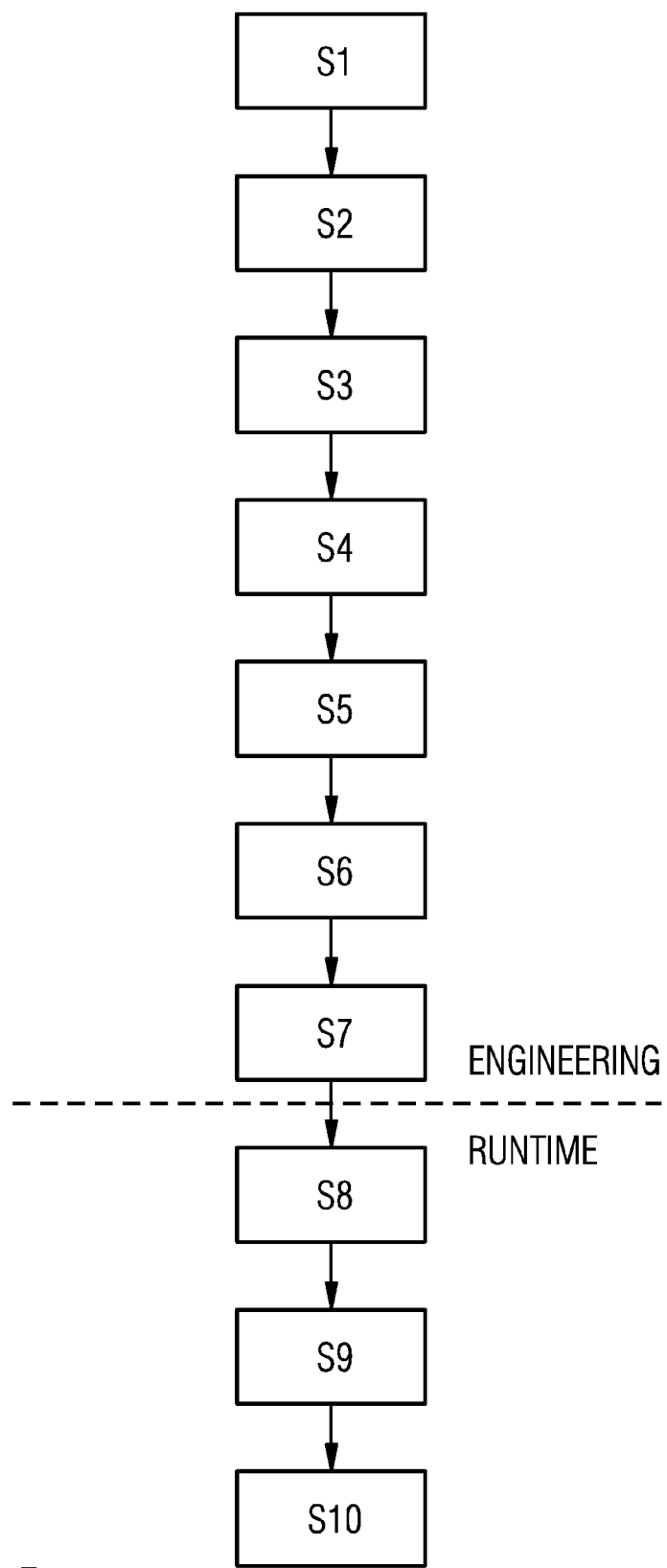
FIG. 5 is an illustration showing the course of activities for modeling the defect management routine in a manufacturing process and for handling the defect during the production process based on said defect management routine.

FIG. 5 schematically the course of steps S1 to S10 for the modeling a defect management routine DMR in a manufacturing process and for handling the defect during the production process based on said defect management routine DMR. Steps S1 to S7 have to be performed during the engineering phase and in the engineering environment of the MES. Therefore, the course of activities can be chosen rather arbitrarily than only in the course as illustrated in FIG. 5.

Step S1 represents the modeling of the production process PS1 to PS4 as well as the creation the defect library DC, DMT_DF_TYP_CTLG of possible defect types DT which may occur possibly during the production process PS1 to PS4. This step S1 forms with respect to the modeling of the production process a major part of the engineering work within the MES. Production modeling usually takes place in a fully graphical programming interface. The better the defect library recognizes the default types possible in the production process the better usually the identification of the defect type DT and the remedial actions against this defect type are.

In step S2 the defect types DT are assigned to at least one defect group Grp-01 to Grp-15, DMT_GRP representing a hierarchical clustering DMT_GRP-GRP_RLTNSHP, DMT_DF_TYP_GRP_RLTNSHP, DMT_DF_TYP_TYP_RLTNSHP to collect different but related defect types DT.

In step S3 a library of defect specifications DMT_SPEC is created thereby linking each defect specification DMT_SPEC to the respective defect types DT, wherein the library of defect specifications may contain for example a number of defect specification criteria DMT_SPEC_RNG, DMT_SPEC_TLRN, DMT_SPEC_SET, DMT_SPEC_VSBL; said defect specification criteria DMT_SPEC_RNG, DMT_SPEC_TLRN, DMT_

SPEC_SET, DMT_SPEC_VSBL can be an out of range failure criteria, a beyond tolerance failure criteria and an out of foreseen set values failure criteria.

Step S4 provides the creation of a library of defect type specification details DMT_SPEC_RNG, DMT_SPEC_TLRN, DMT_SPEC_SET, DMT_SPEC_VSBL assigning the defect types DT to a resource-related context wherein the library of defect type specification details DMT_SPEC advantageously allows to classify a defect type DT to a single production resource or to a single production line or to a production line typology or to a particular material or to a class of materials or to a well-defined production process segment PS1 to PS4.

Step S5 is an optional step and contains to assign an image DMT_IMG, DMT_TYP_IMG of a correct product manufactured according to the production process (PS1 to PS4) to the defect type DT in order enable the workers at shop floor level to compare the current defective pieces against a correct piece.

Step S6 is dedicated to the creation of at least one runtime defect criteria DMT_RT_DF, DMT_RT_SPEC, DMT_DF_CLS that is used to link the defect type DT to a certain production volume which is important to enable the production worker to check a lot or a sub-lot of pieces for any non-conformities.

Step S7 provides the creation of a runtime defect measurement routine DMT_RT_MSR, DMT_RT_MSR_SPEC, DMT_DF_CLS that monitors a result of a corrective measure executed after the identification of the defect type DT. This action is also important in order to be secured whether the corrective action had brought the piece in a condition of conformity or not.

During a runtime production phase, the step S8 is performed to evaluating the product produced according to the production process PS1 to PS4 against predetermined quality criteria or against the predefined conformity rules and shapes. This step for example monitors in a car manufacturing process the presence of the parts that shall be mounted beforehand and checks the quality of the parts. For example, the quality of a coloring process for the car doors is checked against the preferred appearance of the car doors.

In step S9, in case of a violation of the predetermined quality criteria the respective defect type DT out of the library DC, DMT_DF_TYP_CTLG of defect types DT is identified. As mentioned earlier, the quality of this classification depends on the preciseness of the catalogue of predetermined defect types. In particular, the identified defect type DT is used to automatically determine the corrective measure and prosecute within the MES the pieces of non-conformity. Further, the runtime defect criteria DMT_RT_DF, DMT_RT_SPEC, DMT_DF_CLS is determined in order to identify the resource causing the defect type DT to get for example the resource maintained or repaired. Of course, this course of action also include to determine the production volume possibly affected by this defect type (DT) in order to check for example a lot or a sub-lot of pieces against the predetermined quality criteria. In parallel, the respective runtime defect measurement routine DMT_RT_MSR, DMT_RT_MSR_SPEC, DMT_DF_CLS is executed in order to identify whether the corrective measures have been successful and whether the pieces can be re-introduced into the normal workflow as designed by the production process PS1 to PS4.

The invention is claimed is:

1. A method for modeling a defect management routine in a production process and for handling the defect during the production process based on the defect management routine, both the modeling and the handling being executed within a manufacturing execution system, which comprises the steps of:
during an engineering phase, performing the steps of:
modeling the production process to create a library of possible defect types which may occur during the production process;
assigning the defect types to at least one defect group reresenting a hierarchical clustering to collect different but related defect types;
creating a library of defect specifications, each defect specification being linked to the defect types;
creating a library of defect type specification details assigning the defect types to a resource-related context;
creating at least one runtime defect criteria used to link the defect type to a certain production volume;
creating a runtime defect measurement routine monitoring a result of a corrective measure executed after an identification of the defect type; and
during a runtime production phase, performing the steps of:
evaluating a product produced according to the production process against predetermined quality criteria;
identifying, for the product, the respective defect type out of the library of defect types in case of a violation of the predetermined quality criteria;
using an identified defect type to:
determine and prosecute a corrective measure for the product,
determine a runtime defect criteria identifying a resource causing the defect type,
determine a production volume possibly affected by the defect type, and
run the runtime defect measurement routine in order to identify whether the corrective measures have been successful and whether the product can be re-introduced into a normal workflow.

2. The method according to claim 1, which further comprises assigning to each of the defect types, a default severity.

3. The method according to claim 1, which further comprises shaping an organization of a group as a tree structure thereby configuring a type of group ownership at a desired level of a group hierarchy.

4. The method according to claim 1, wherein the library of defect specifications contains a number of defect specification criteria, the defect specification criteria are an out of range failure criteria, a beyond tolerance failure criteria or an out of foreseen set values failure criteria.

5. The method according to claim 1, wherein the library of defect type specification details allows to classify the defect type to one of a single production resource, to a single production line, to a production line typology, to a particular material, to a class of materials or to a well-defined production process segment.

6. The method according to claim 1, which further comprises assigning an image of a correct product manufactured according to the production process to the defect type.

7. A method for modeling a defect management routine in a production process and for handling the defect during the production process based on the defect management routine, both the modeling and the handling being executed within a manufacturing execution system, which comprises the steps of:
 during an engineering phase, performing the steps of:
  modeling the production process to create a library of possible defect types which may occur during the production process;
  assigning the defect types to at least one defect group representing a hierarchical clustering to collect different but related defect types;
  creating a library of defect specifications, each defect specification being linked to the defect types;
  creating a library of defect type specification details assigning the defect types to a resource-related context;
  creating at least one runtime defect criteria used to link the defect type to a certain production volume;
  creating a runtime defect measurement routine monitoring a result of a corrective measure executed after an identification of the defect type; and
 during a runtime production phase, performing the steps of:
  evaluating a product produced according to the production process against predetermined quality criteria;
  identifying, for the product, the respective defect type out of the library of defect types in case of a violation of the predetermined quality criteria;
  using an identified defect type to:
   automatically determine and prosecute a corrective measure for the product,
   determine a runtime defect criteria identifying a resource causing the defect type,
   determine a production volume possibly affected by the defect type, and
   run the runtime defect measurement routine in order to identify whether the corrective measures have been successful and whether the product can be re-introduced into a normal workflow.

\* \* \* \* \*